(12) United States Patent
Tomita et al.

(10) Patent No.: US 7,605,085 B2
(45) Date of Patent: Oct. 20, 2009

(54) METHOD OF MANUFACTURING INTERCONNECTING STRUCTURE WITH VIAS

(75) Inventors: Kazuo Tomita, Tokyo (JP); Keiji Hashimoto, Tokyo (JP); Yasutaka Nishioka, Tokyo (JP); Susumu Matsumoto, Osaka (JP); Mitsuru Sekiguchi, Shiga (JP); Akihisa Iwasaki, Osaka (JP)

(73) Assignees: Renesas Technology Corp., Tokyo (JP); Panasonic Corporation, Osaka (JP)

( * ) Notice: Subject to any disclaimer, the term of this patent is extended or adjusted under 35 U.S.C. 154(b) by 0 days.

(21) Appl. No.: 11/532,603

(22) Filed: Sep. 18, 2006

(65) Prior Publication Data
US 2007/0007658 A1 Jan. 11, 2007

Related U.S. Application Data

(63) Continuation of application No. 10/791,751, filed on Mar. 4, 2004, now abandoned.

(30) Foreign Application Priority Data
Aug. 12, 2003 (JP) ............................. 2003-292166

(51) Int. Cl.
*H01L 21/311* (2006.01)
(52) U.S. Cl. ................. 438/700; 438/618; 438/637; 438/638; 438/666; 438/668; 257/E23.145; 257/774
(58) Field of Classification Search .......... 257/E23.142, 257/E23.145, E23.167, 758, 774; 438/618, 438/624, 634, 666, 637–639, 668, 700, 740
See application file for complete search history.

(56) References Cited

U.S. PATENT DOCUMENTS

| | | | | |
|---|---|---|---|---|
| 5,880,018 A | | 3/1999 | Boech et al. | |
| 6,001,733 A | * | 12/1999 | Huang et al. | 438/633 |
| 6,001,739 A | * | 12/1999 | Konishi | 438/692 |
| 6,077,769 A | * | 6/2000 | Huang et al. | 438/622 |
| 6,150,272 A | * | 11/2000 | Liu et al. | 438/692 |
| 6,225,207 B1 | * | 5/2001 | Parikh | 438/622 |
| 6,295,222 B2 | | 9/2001 | Higashide et al. | |
| 6,295,721 B1 | | 10/2001 | Tsai | |

(Continued)

FOREIGN PATENT DOCUMENTS

DE        100 51 601        7/2001

(Continued)

OTHER PUBLICATIONS

K. Higashi et al., "A Manufacturable Copper/Low-k SIOC/SICN Process Technology for 90nm-node High Performance eDRAM", Proceedings of the 2002 International Interconnect Technology Conference, pp. 15-17.

*Primary Examiner*—Chris C Chu
(74) *Attorney, Agent, or Firm*—Leydig, Voit & Mayer, Ltd.

(57) ABSTRACT

First wirings and first dummy wirings are formed in a p-SiOC film formed on a substrate. A p-SiOC film is formed, and a cap film is formed on the p-SiOC film. A dual damascene wiring, including vias connected to the first wirings and the second wirings, is formed in the cap film and the p-SiOC film 22. Dummy vias are formed on the periphery of isolated vias.

6 Claims, 13 Drawing Sheets

U.S. PATENT DOCUMENTS

| | | |
|---|---|---|
| 6,319,809 B1 * | 11/2001 | Chang et al. ............... 438/597 |
| 6,329,280 B1 | 12/2001 | Cook et al. |
| 6,337,270 B2 * | 1/2002 | Umemoto ................... 438/637 |
| 6,350,674 B1 * | 2/2002 | Okamura .................... 438/624 |
| 6,365,504 B1 * | 4/2002 | Chien et al. ................. 438/624 |
| 6,399,897 B1 | 6/2002 | Umematsu et al. |
| 6,400,628 B2 | 6/2002 | Dosaka et al. |
| 6,452,274 B1 | 9/2002 | Hasegawa et al. |
| 6,468,894 B1 * | 10/2002 | Yang et al. .................. 438/622 |
| 6,486,558 B2 | 11/2002 | Sugiyama et al. |
| 6,492,259 B2 | 12/2002 | Dirahoui et al. |
| 6,492,734 B2 * | 12/2002 | Watanabe ................... 257/758 |
| 6,570,243 B1 | 5/2003 | Higihara |
| 6,582,974 B2 * | 6/2003 | Lui et al. ....................... 438/6 |
| 6,593,232 B1 * | 7/2003 | Huang et al. ............... 438/637 |
| 6,717,267 B1 * | 4/2004 | Kunikiyo ................... 257/758 |
| 6,740,940 B2 | 5/2004 | Kim et al. |
| 6,765,297 B2 | 7/2004 | Aoyama et al. |
| 6,780,498 B2 | 8/2004 | Nakata et al. |
| 6,798,073 B2 | 9/2004 | Lin et al. |
| 6,812,130 B1 | 11/2004 | Brase |
| 6,818,570 B2 | 11/2004 | Tsuji et al. |
| 6,861,686 B2 * | 3/2005 | Lee et al. .................... 257/291 |
| 7,053,487 B2 | 5/2006 | Saito et al. |
| 7,067,919 B2 | 6/2006 | Watanabe et al. |
| 2002/0151131 A1 | 10/2002 | Mori |

FOREIGN PATENT DOCUMENTS

| | | |
|---|---|---|
| JP | 10-199882 | 7/1998 |
| JP | 11-154679 | 6/1999 |
| JP | 11-297817 | 10/1999 |
| JP | 2001-024060 | 1/2001 |
| JP | 2001-053143 | 2/2001 |
| JP | 2001-168093 | 6/2001 |
| JP | 2001-196372 | 7/2001 |
| JP | 2001-230250 | 8/2001 |
| JP | 2001-298081 | 10/2001 |
| JP | 2002-284998 A | 10/2002 |
| JP | 2002-313908 A | 10/2002 |
| JP | 2003-152077 | 5/2003 |
| JP | 2003-197623 A | 7/2003 |
| KR | 2001-014849 | 2/2001 |
| KR | 2002-076293 | 10/2002 |

* cited by examiner

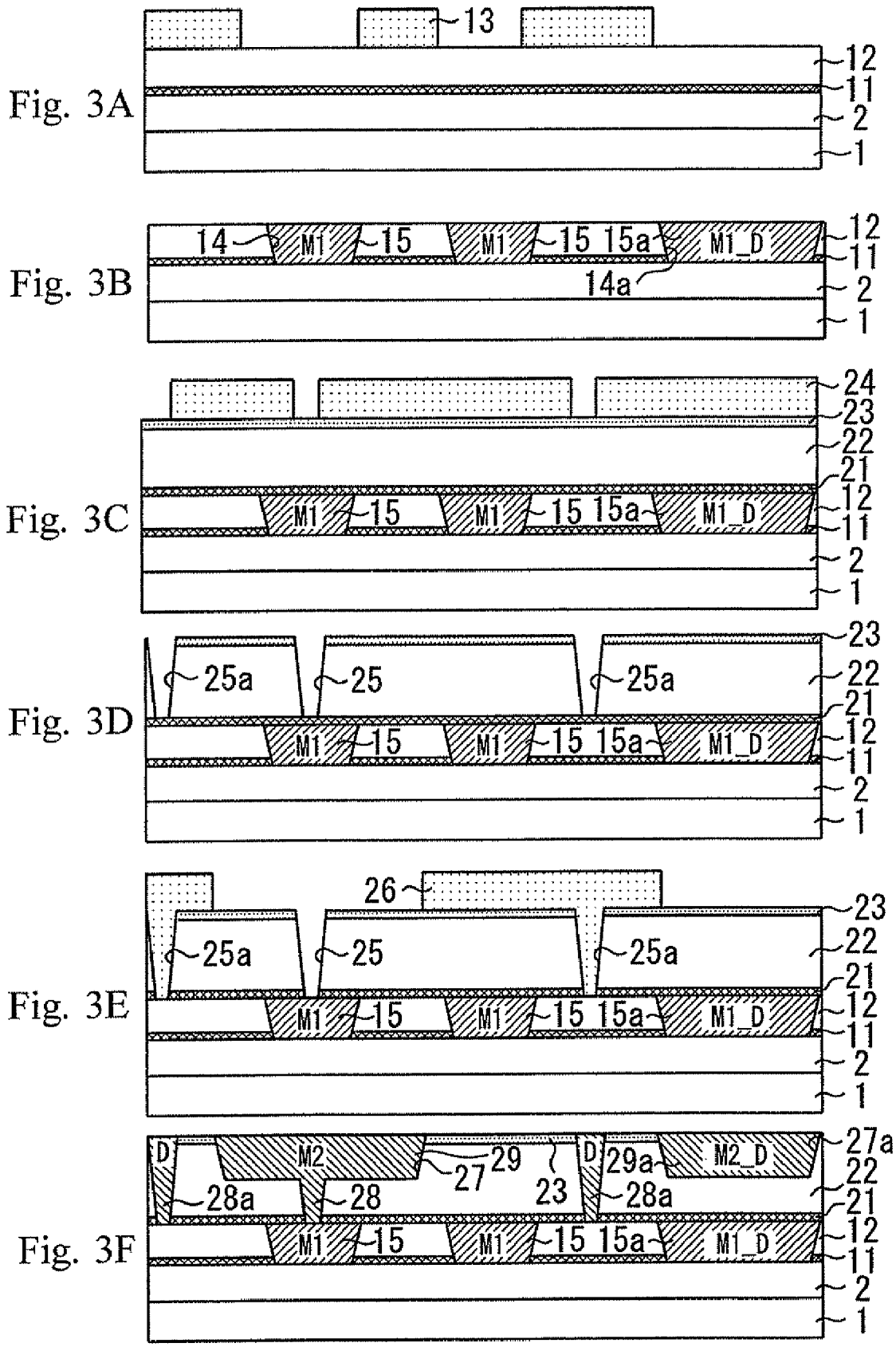

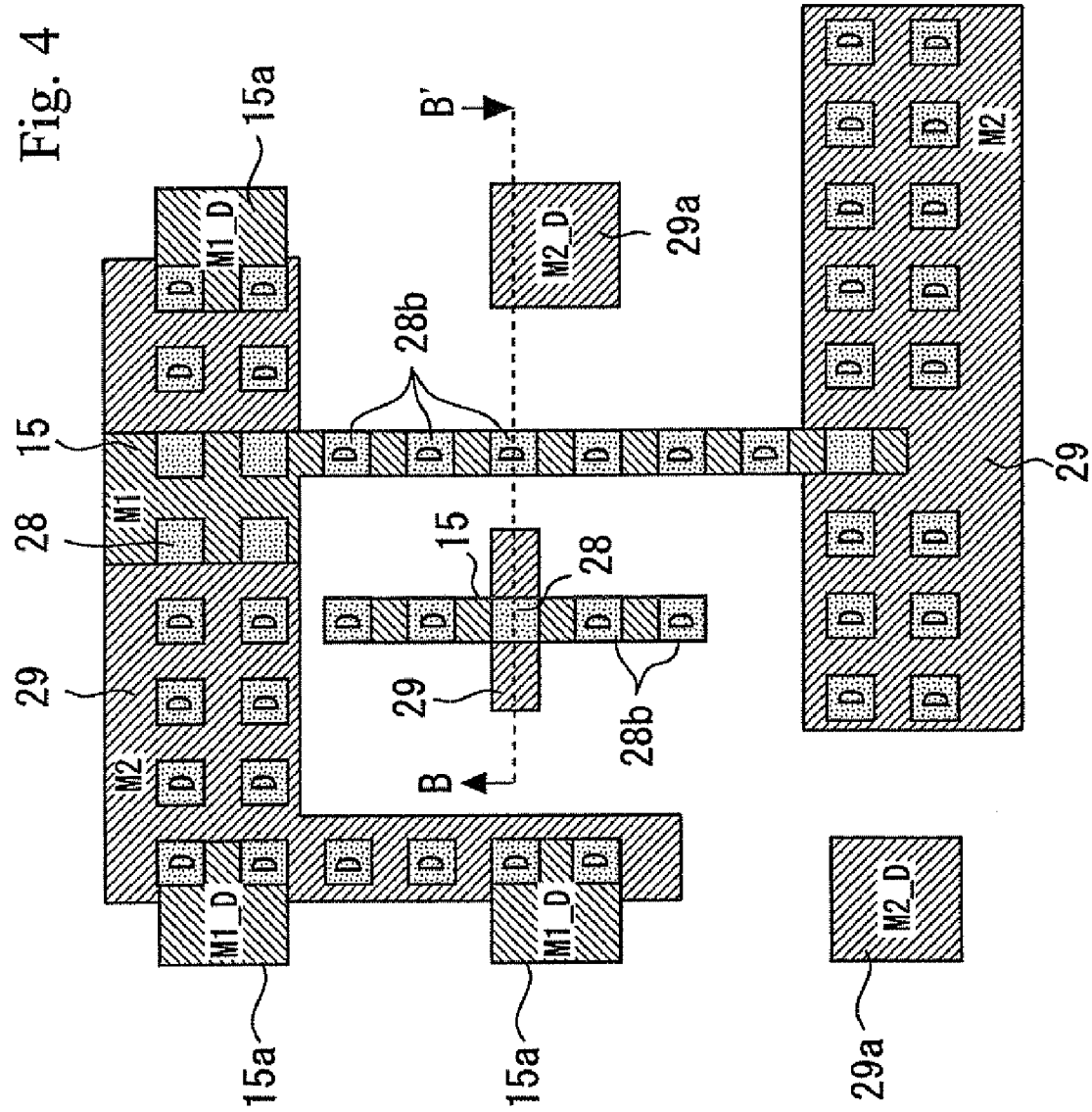

METHOD OF MANUFACTURING INTERCONNECTING STRUCTURE WITH VIAS

FIELD OF THE INVENTION

The present invention relates to an interconnecting structure, and more specifically to an interconnecting structure of an electronic device represented by a semiconductor device having dummy vias.

DESCRIPTION OF THE BACKGROUND ART

FIG. 12 is a schematic top view for illustrating an interconnecting structure in a conventional semiconductor device. FIG. 13 is a sectional view taken along the line F-F' of FIG. 12 showing the interconnecting structure manufactured using a dual damascene method.

As FIGS. 12 and 13 show, dual damascene interconnects including vias 28 connected to first wirings (M1) 15 and second wirings (M2) 29 connected to the vias 28 are formed. Furthermore, in order to eliminate density difference between wiring patterns, first dummy wirings 15a are formed on the peripheries of the first wirings 15, and second dummy wirings 29a are formed on the peripheries of the second wirings 29.

In recent years, the miniaturization of semiconductor devices has caused an accompanying problem of wiring signal delay. In order to solve such a problem, copper (Cu) is used as a wiring material, and a low-k dielectric film 30 having a low dielectric constant (k) is used as an interlayer dielectric film (for example, refer to Non-Patent Document "K. Hayashi et al., Proceedings of the 2002 International Interconnect Technology Conference, pp. 15-17").

However, when a dimension of vias is reduced, density difference between isolated vias and dense vias is enlarged due to the proximity effect. Furthermore, when vias are formed using a low-k dielectric film as an interlayer dielectric film, and when a chemically amplified resist, such as a KrF resist and an ArF resist, is used as a mask, the problems of via resistance elevation and the occurrence of wire breaking are caused, in particular in isolated vias, by an acid of the chemically amplified resist. In other words, a problem of the occurrence of a phenomenon known as "resist poisoning" arises in vias, in particular in isolated vias. These problems are often caused when a cap film including different insulating films is formed on a low-k dielectric film in order to prevent causing ashing damage to the low-k dielectric film.

In addition, for example, in electronic devices such as high-technology logic circuit products, the source voltage is lowered to reduce power consumption. Therefore, a problem of malfunction is often caused by external noise.

SUMMARY OF THE INVENTION

The present invention has been conceived to solve the previously-mentioned problems and a general object of the present invention is to provide a novel and useful interconnecting structure.

One more specific object of the present invention is to inhibit the occurrence of resist poisoning when vias are formed in a low-k dielectric film. Another more specific object of the present invention is to provide an interconnecting structure having a high margin against external noise.

The above object of the present invention is attained by a following interconnecting structure.

According to an aspect of the present invention, the interconnecting structure comprises first wirings formed on a substrate. A low-k dielectric film is formed on the first wirings, the low-k dielectric film having dielectric constant of 3 or less. Vias are formed in the low-k dielectric film and connected to the first wiring. Second wirings are formed on the vias and connected to the vias. Dummy vias are formed on the periphery of an isolated via of the vias.

Other objects and further features of the present invention will be apparent from the following detailed description when read in conjunction with the accompanying drawings.

BRIEF DESCRIPTION OF THE DRAWINGS

FIGS. 3A to 3F are sectional process diagrams for illustrating the method for manufacturing the interconnecting structure shown in FIG. 2A;

FIG. 4 is a schematic top view for illustrating an interconnecting structure in a semiconductor device according to a second embodiment of the present invention;

DETAILED DESCRIPTION OF THE PREFERRED EMBODIMENTS

Figure 1:
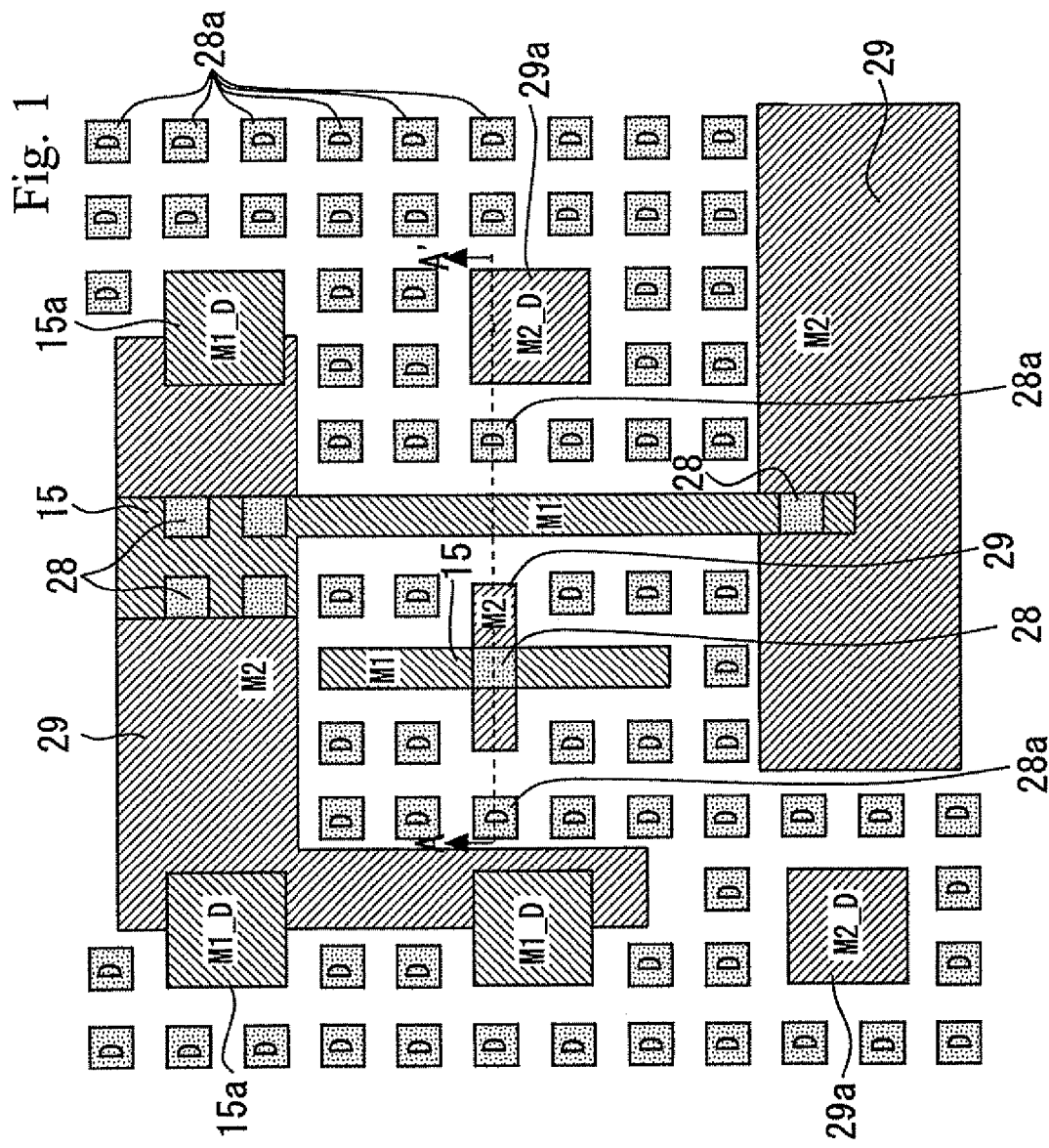
FIG. 1 is a schematic top view for illustrating an interconnecting structure in a semiconductor device according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

First, an interconnecting structure will be described.

Figure 2A:
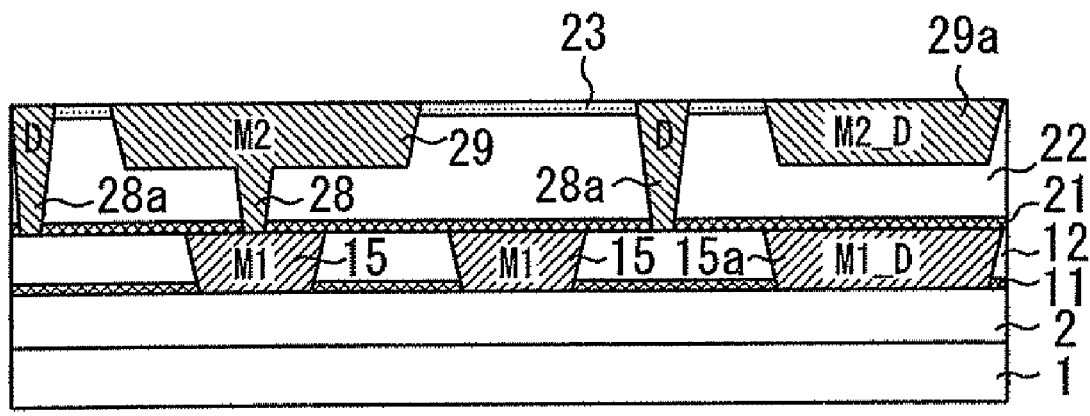
FIGS. 2A and 2B are sectional views taken along the line A-A' of FIG. 1 showing the interconnecting structure manufactured using a dual damascene method.
Figure 2B:
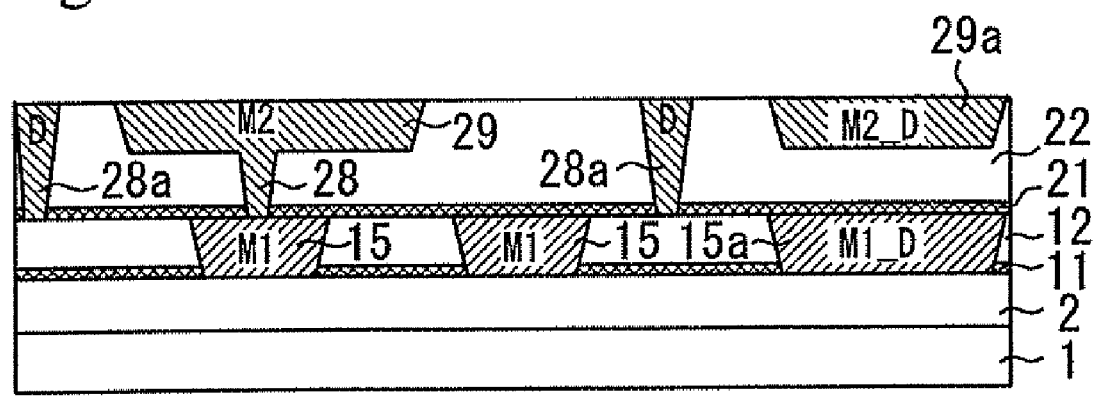

FIG. 1 is a schematic top view for illustrating an interconnecting structure in a semiconductor device according to a first embodiment of the present invention. FIGS. 2A and 2B are sectional views taken along the line A-A' of FIG. 1 showing the interconnecting structure manufactured using a dual damascene method.

Next, the interconnecting structure will be described referring to FIG. 1 and FIG. 2A.

An HDP oxide film as an interlayer dielectric film 2 is formed on a substrate 1. Here, the substrate 1 is, for example, a P-type silicon wafer having a resistivity of 10 Ω·cm. A p-SiC film is formed as a stopper film 11 on the HDP oxide film 2, and a p-SiOC film is formed as a low-k dielectric film 12 on the p-SiC film 11. First wirings (M1) 15 are formed in the p-SiC film 11 and the p-SiOC film 12, and first dummy wirings (M1_D) 15a are formed on the peripheries of the first wirings 15. The first dummy wirings 15a have a dimension of, for example, 1 μm×1 μm, and are formed in a pitch of 2 μm.

A p-SiC film as a stopper film 21 is formed on the p-SiOC film 12, the first wirings 15, and the first dummy wirings 15a; and the p-SiOC film as a low-k dielectric film 22 is formed on the p-SiC film 21. As FIG. 2A shows, a cap film 23 is formed on the p-SiOC film 22. The cap film 23 is formed to prevent causing ashing damage to the low-k dielectric film 22, and is an insulating film of a kind different from the low-k dielectric film 22. As described later in detail, the cap film 23 may be removed finally by a CMP method as FIG. 2B shows.

Dual damascene wirings 28 and 29, including vias 28 connected to first wirings 15 and second wirings 29 connected to the vias 28, are formed in the cap film 23 the p-SiOC film 22 and the p-SiC film 21.

On the peripheries of an isolated dual damascene wirings 28 and 29, dummy vias 28a not connected to any wirings, and second dummy wirings 29a are formed. The dummy vias 28a have a dimension of, for example, 0.15 μm, and are formed in a pitch of 0.5 μm. The second dummy wirings 29a have a dimension of, for example, 1 μm×1 μm, and are formed in a pitch of 2 μm.

Next, a method for manufacturing the above-described interconnecting structure using a dual damascene method will be described.

FIGS. 3A to 3F are sectional process diagrams for illustrating the method for manufacturing the interconnecting structure shown in FIG. 2A.

First a trench (not shown) of a depth, for example, of 300 nm is formed in a substrate 1 using an STI (shallow trench isolation) method.

Next, an oxide film 2 (hereafter referred to as "HDP oxide film") of a thickness of 1,000 nm is formed on the substrate 1 using the HDP-CVD method, and the HDP oxide film 2 is polished by 300 nm using a CMP method. Next, a p-SiC film 11 of a thickness, for example, of 50 nm is formed on the HDP oxide film 2 using a CVD method. Then, a p-SiOC film 12 of a thickness, for example, of 400 nm is formed thereon using a CVD method, and the p-SiOC film 12 is polished by 150 nm using a CMP method. Furthermore, a chemically amplified resist pattern (hereafter referred simply to as "resist pattern") 13 for forming first wirings and first dummy wirings is formed. Thereby, a structure as shown in FIG. 3A is obtained.

Next, as FIG. 3B shows, first wirings 15 and first dummy wirings 15a are formed in the p-SiOC film 12 and the p-SiC film 11 using a damascene method. Specifically, openings 14 and 14a are formed in the p-SiOC film 12 and the p-SiC film 11 by dry etching using the resist pattern 13. Then in these openings 14 and 14a, barrier metals, for example, Ta/TaN films of each thickness of 10 nm/10 nm are formed, and a Cu seed layer of a thickness of, for example, 100 nm is deposited on the barrier metal using sputtering, and Cu of a thickness of 500 nm is deposited using plating. Thereafter, unnecessary Cu and barrier metal is removed using a CMP method.

Next, as FIG. 3C shows, a p-SiC film 21 of a thickness, for example, of 50 nm is formed using a CVD method, a p-SiOC film 22 of a thickness, for example, of 600 nm is formed thereon using a CVD method, and the p-SiOC film 22 is polished by 200 nm using a CMP method. Then a cap film 23 of a thickness, for example, of 50 nm to 200 nm is formed on the p-SiOC film 22 using a CVD method. Furthermore, a resist pattern 24 for forming vias/dummy vias is formed on the cap film 23.

Next, as FIG. 3D shows, a via hole (connecting hole) 25 reaching the surface of the stopper film 21 is formed in the cap film 23 and the p-SiOC film 22 by dry etching using the resist pattern 24 as a mask, and dummy via holes 25a are formed on the periphery of an isolated via hole 25.

Next, as FIG. 3E shows, the stopper film 21 is subjected to dry etching to extend the via hole 25 and connect the via hole 25 to the first wiring 15. Then a resist pattern 26 is formed on the cap film 23 including the inside of the dummy via holes 25a. Thereby, resist vias, which are dummy via holes 25a filled with the resist are formed.

Next, openings (trenches for wirings) 27 and 27a are formed in the cap film 23 and the p-SiOC film 22 by dry etching using the resist pattern 26 as a mask. Then, a barrier metal (Ta/TaN=10 nm/10 nm) is formed in the openings 27 and 27a, a Cu seed layer of a thickness of 100 nm is deposited on the barrier metal using sputtering, and Cu of a thickness of 500 nm is deposited using plating. Thereafter, unnecessary Cu and barrier metal is removed using a CMP method. Thereby, the structure as shown in FIG. 3F is obtained. In other words, dual damascene wirings 28 and 29, including vias 28 connected to first wirings 15 and second wirings 29 connected to the via 28, are formed. Furthermore, dummy vias 28a are formed on the periphery of the isolated via 28, and second dummy wirings 29a are formed on the periphery of the second wiring 29.

Alternatively, the cap film 23 may be removed when Cu and the barrier metal is subjected to CMP. In other words, as FIG. 2B shows, the presence of the cap film 23 is optional in the final interconnecting structure (The same applies to Embodiments 2 to 5 described later.). Even when the cap film 23 is removed, the equivalent device characteristics as in the case where the cap film 23 remains (FIG. 2A) can be obtained.

In the first embodiment, as described above, dummy vias 28a are formed on the periphery of an isolated via 28 in the p-SiOC film 22, which is a low-k dielectric film. Thereby, the present inventors found that the occurrence of resist poisoning could be prevented when the isolated via 28 was formed in the low-k dielectric film 22.

In addition, since density difference between isolated vias and dense vias due to the proximity effect is inhibited, the dimensional controllability of vias 28 is improved.

In the first embodiment, since the opening ratio of vias is high, the endpoint of etching for forming via holes 25 and 25a can be detected stably. Thereby, the via holes passing through the underlying films, or defective openings can be prevented, and a wide process margin can be secured.

Also, since the formation of dummy vias makes the occupation ratio of vias to the pattern uniform, the occurrence of erosion and dishing during polishing vias (plugs) can be prevented.

In the first embodiment, although the case wherein the dimension of dummy vias is 0.15 μm is described, the above-described effects can be obtained as long as the dimension of dummy vias is 1 to 10 times the minimum dimension of the via 28. Also, the pitch of dummy vias is not limited to 0.5 μm, but may be optional if the occupation ratio of vias to the pattern is constant within a range between 0.5% and 30%. The shape of the dummy vias is not limited to the shape having a square opening cross section as shown in FIG. 1, but the above-described effects can also be obtained from cylindrical shapes, or slit shapes having rectangular opening cross sections (The same applies to second to fifth embodiments described later.).

Although p-SiOC films are used as low-k dielectric films 12 and 22, the present invention is not limited thereto, but any low-k dielectric films can be applied as long as dielectric constant of the low-k dielectric film is 3 or less. Furthermore, ultra-low-k dielectric films, such as porous films, can also be applied. Also, although p-SiC films are used as stopper films 11 and 21, p-SiN films can also be used, and laminated films of p-SiC films and p-SiN films can also be used. Furthermore, the stopper film is not necessarily required if a sufficient selection ratio to underlying films can be secured. Although W or Cu are used as the material for the vias (plugs), other conductive materials, such as TaN, TiN, Ta and Ti, or the laminate thereof can also be used (The same applies to second to fifth embodiments described later.).

Second Embodiment

Figure 5:
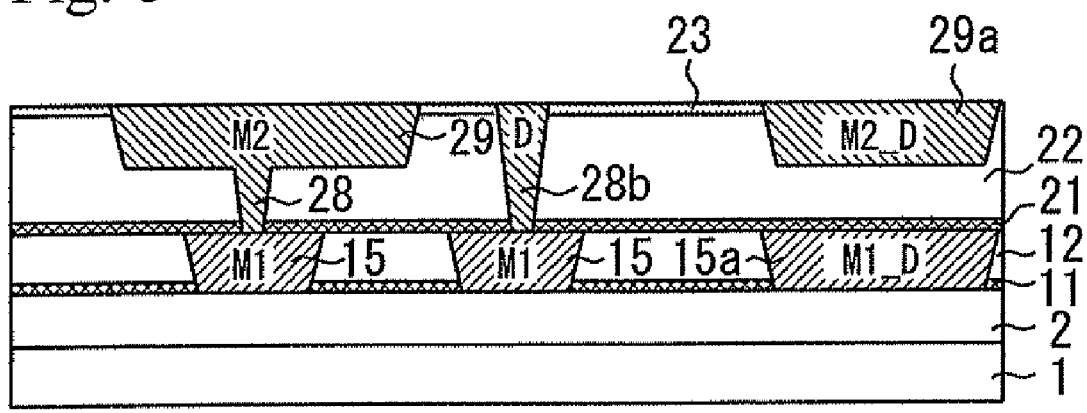
FIG. 5 is a sectional view taken along the line B-B' of FIG. 4 showing the interconnecting structure manufactured using a dual damascene method.

FIG. 4 is a schematic top view for illustrating an interconnecting structure in a semiconductor device according to a second embodiment of the present invention. FIG. 5 is a sectional view taken along the line B-B' of FIG. 4 showing the interconnecting structure manufactured using a dual damascene method.

Although dummy vias 28a not connected to the first and second wirings 15 and 29 are disposed on the periphery of the isolated via 28 in the first embodiment, dummy vias 28b connected to the first wirings 15 are disposed on the periphery of the isolated via 28 in the second embodiment.

Therefore, according to the second embodiment, the equivalent effects as the effects obtained in the first embodiment can be obtained.

Furthermore, in the second embodiment, the use of the dual damascene method can reduce the stress migration of first and second wirings 15 and 29 having large wiring width.

In the second embodiment, although the dummy vias 28b are connected only to the first wirings 15, the dummy vias may be connected only to the second wirings 29, and the mixture of these dummy vias may be present on the periphery of the isolated via 28.

Third Embodiment

Figure 6:
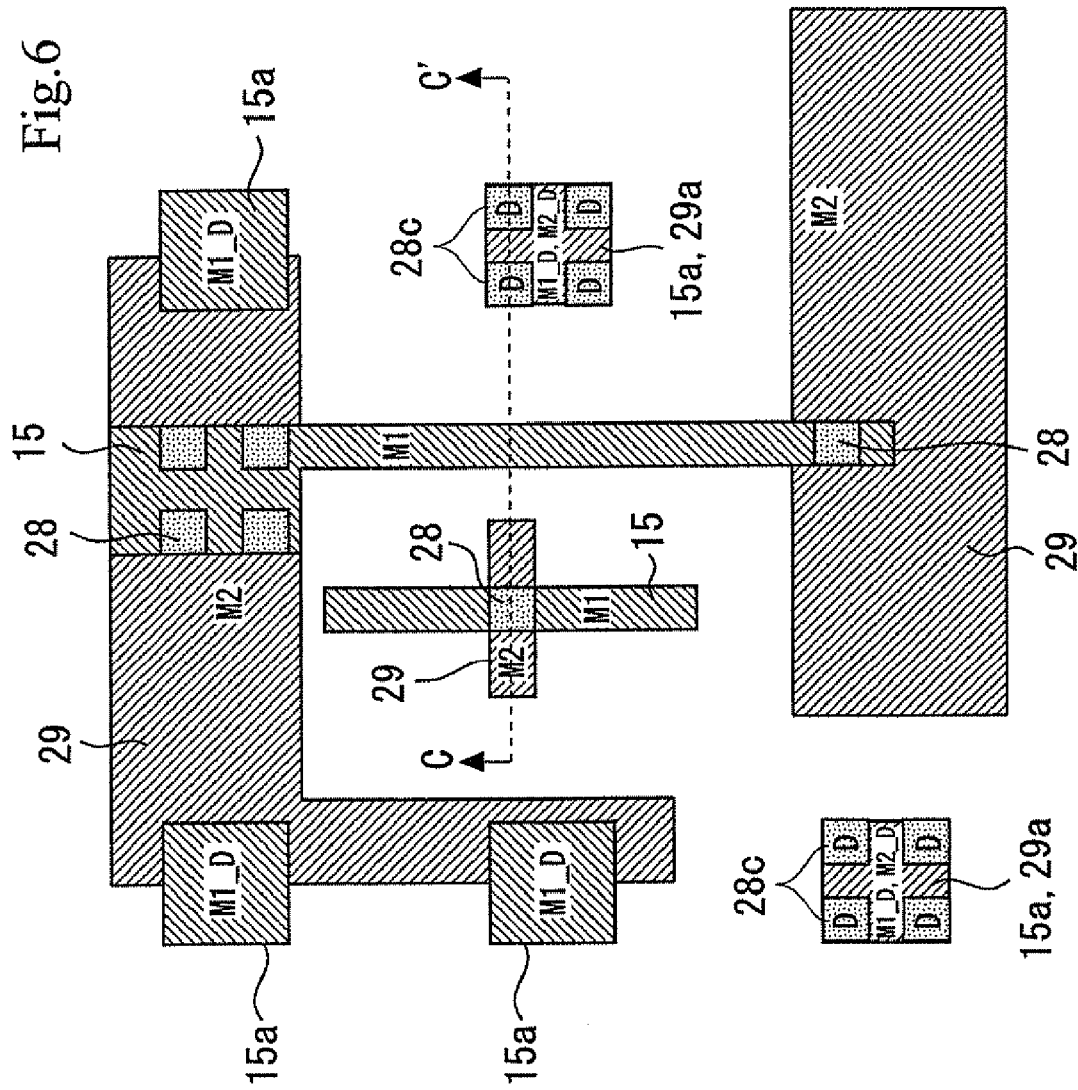
FIG. 6 is a schematic top view for illustrating an interconnecting structure in a semiconductor device according to a third embodiment of the present invention.
Figure 7:
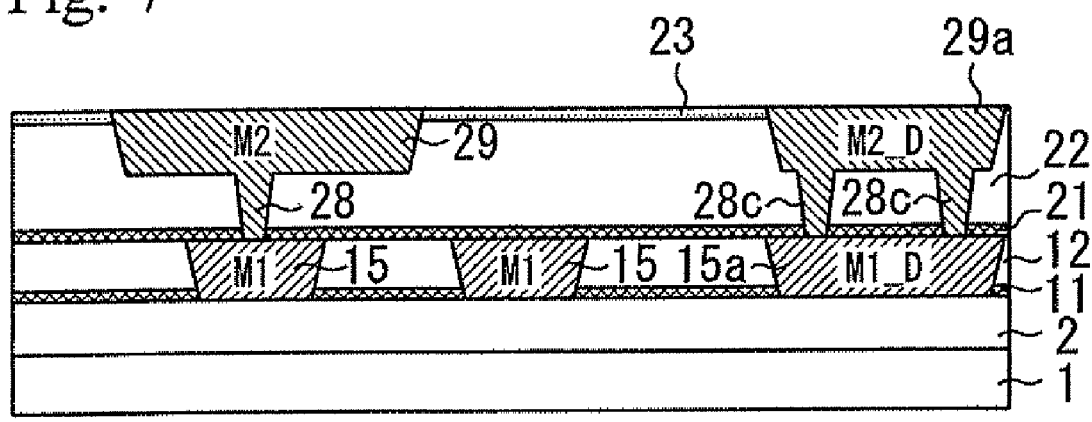
FIG. 7 is a sectional view taken along the line C-C' of FIG. 6 showing the interconnecting structure manufactured using a dual damascene method.

FIG. 6 is a schematic top view for illustrating an interconnecting structure in a semiconductor device according to a third embodiment of the present invention. FIG. 7 is a sectional view taken along the line C-C' of FIG. 6 showing the interconnecting structure manufactured using a dual damascene method.

Although dummy vias 28a not connected to the first and second wirings 15 and 29 are disposed on the periphery of the isolated via 28 in the first embodiment, dummy vias 28c connected to both the first dummy wirings 15a and the second dummy wirings 29a are disposed on the periphery of the isolated via 28 in the third embodiment.

Therefore, according to the third embodiment, the equivalent effects as the effects obtained in the first embodiment can be obtained.

Also, increase of via resistance and defective wirings due to stress migration can be inhibited substantially without increasing the circuit capacity.

Furthermore, in the third embodiment, the use of the dual damascene method can reduce the stress migration of first and second wirings 15 and 29 having large wiring width.

Fourth Embodiment

Figure 8:
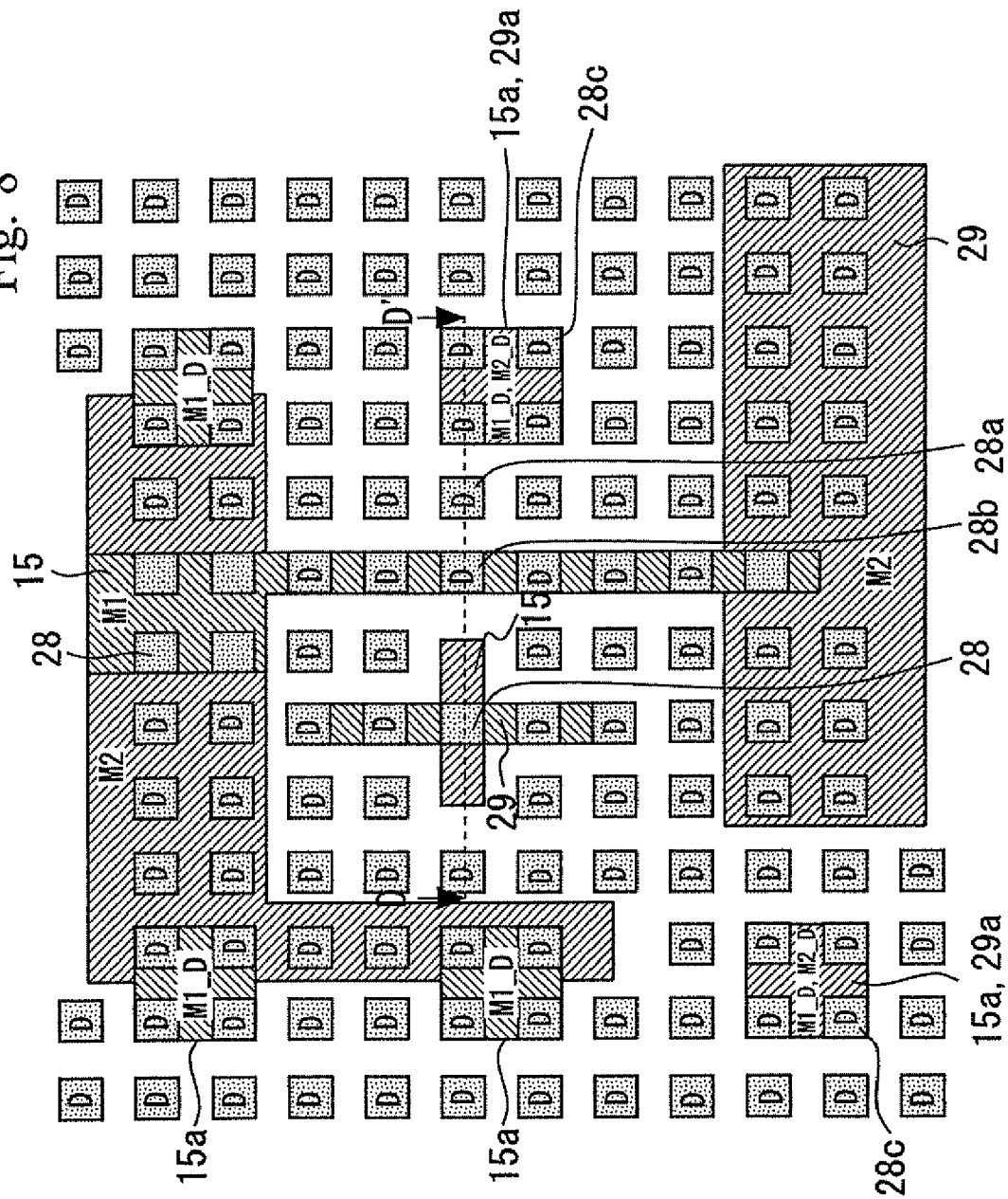
FIG. 8 is a schematic top view for illustrating an interconnecting structure in a semiconductor device according to a fourth embodiment of the present invention.
Figure 9:
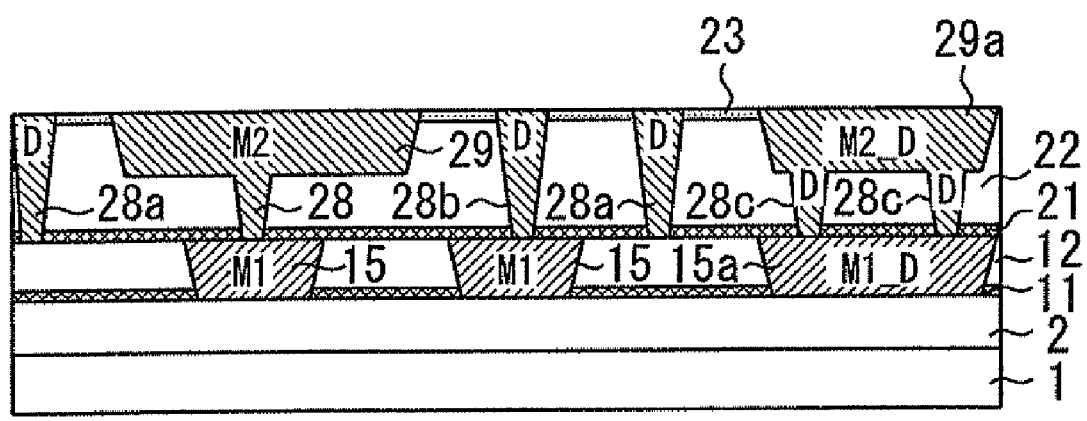
FIG. 9 is a sectional view taken along the line D-D' of FIG. 8 showing the interconnecting structure manufactured using a dual damascene method.

FIG. 8 is a schematic top view for illustrating an interconnecting structure in a semiconductor device according to a fourth embodiment of the present invention. FIG. 9 is a sectional view taken along the line D-D' of FIG. 8 showing the interconnecting structure manufactured using a dual damascene method.

As FIGS. 8 and 9 show, in an interconnecting structure according to the fourth embodiment, dummy vias 28a connected to neither first wirings 15 nor second wirings 29, dummy vias 28b connected to first wirings 15, and dummy vias 28c connected to both first dummy wirings 15a and second dummy wirings 29a are disposed on the periphery of the isolated via 28. In other words, all of dummy vias 28a, 28b, and 28c in the first to third embodiments are applied.

Therefore, according to the fourth embodiment, the equivalent effects as the effects obtained in the first embodiment can be obtained. The fourth embodiment is suitable for the reduction of stress migration particularly when wirings 15 and 29 having large wiring width are formed.

Fifth Embodiment

Figure 10:
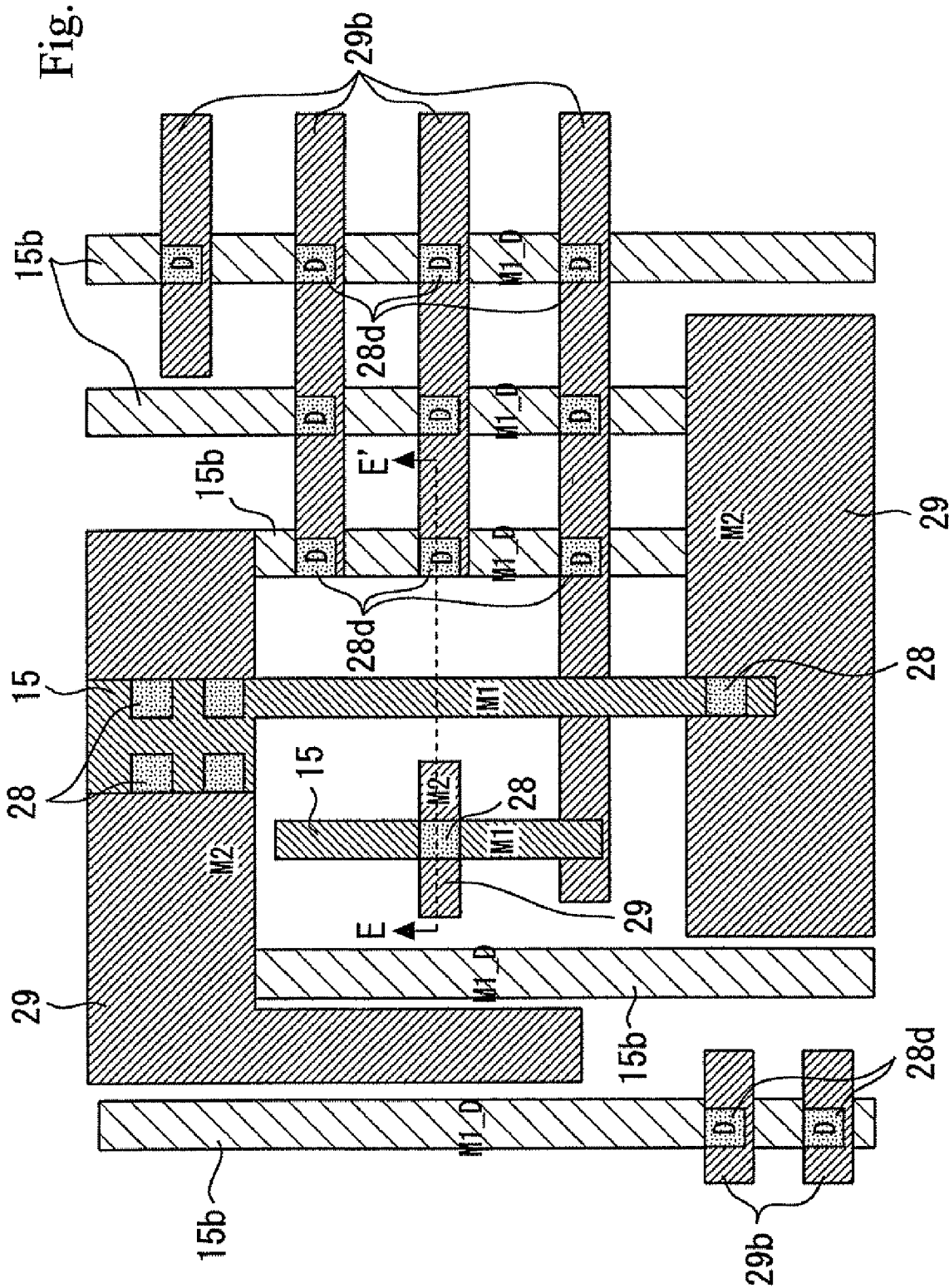
FIG. 10 is a schematic top view for illustrating an interconnecting structure in a semiconductor device according to a fifth embodiment of the present invention.
Figure 11:
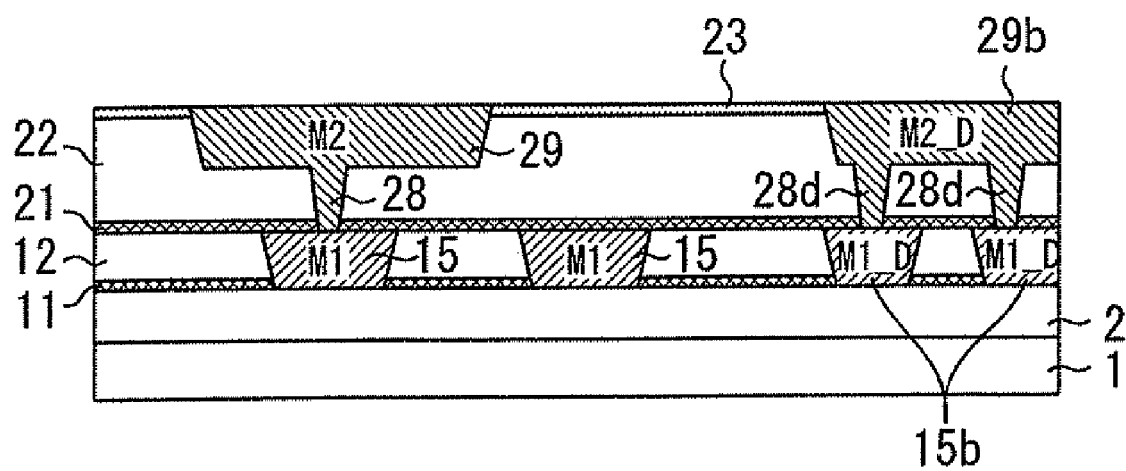
FIG. 11 is a sectional view taken along the line E-E' of FIG. 10 showing the interconnecting structure manufactured using a dual damascene method.
Figure 12:
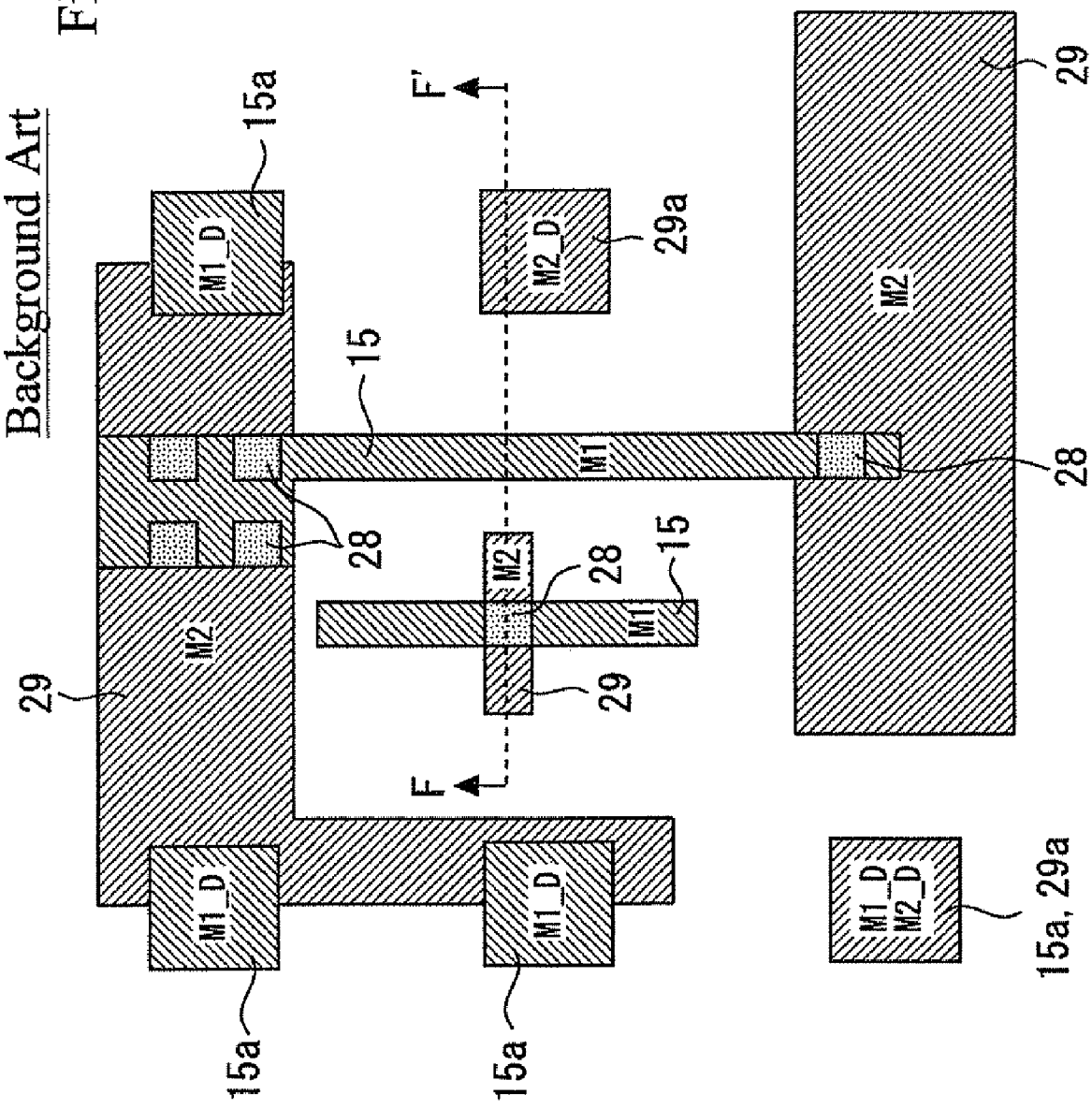
FIG. 12 is a schematic top view for illustrating an interconnecting structure in a conventional semiconductor device.
Figure 13:
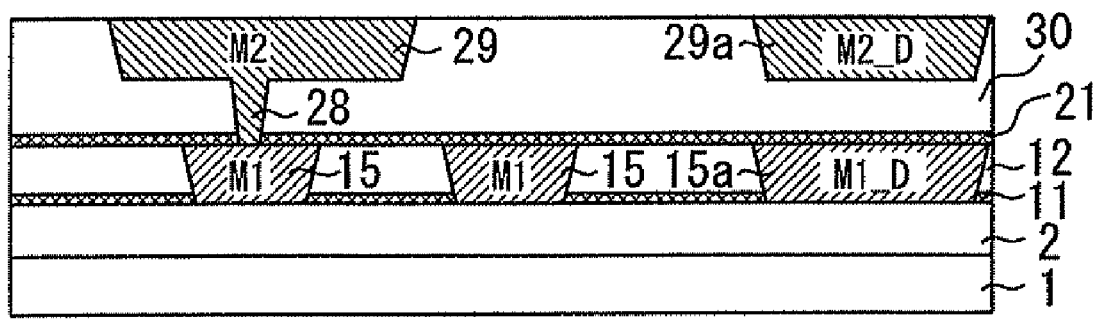
FIG. 13 is a sectional view taken along the line F-F' of FIG. 12 showing the interconnecting structure manufactured using a dual damascene method.

FIG. 10 is a schematic top view for illustrating an interconnecting structure in a semiconductor device according to a fifth embodiment of the present invention. FIG. 11 is a sectional view taken along the line E-E' of FIG. 10 showing the interconnecting structure manufactured using a dual damascene method.

In the above-described third embodiment, first and second dummy wirings 15a and 29a of a size of 1 μm×1 μm are formed on the peripheries of first and second wirings 15 and 29, and the wirings 15a and 29a are connected with dummy vias 28c.

In the fifth embodiment, as FIGS. 10 and 11 show, first dummy wirings 15b including line patterns of a line width of 0.5 μm are formed in a pitch of 2 μm on the periphery of the first wirings 15. Furthermore, second dummy wirings 29b including line patterns of a line width of 0.5 μm are formed in a pitch of 2 μnm on the periphery of the first wirings 15 so as to intersect the first dummy wirings 15b. In addition, dummy vias 28d are disposed on the intersections of the first dummy wirings 15b and the second dummy wirings 29b. Thereby, the potential of the dummy pattern, including the first and second dummy wirings 15b and 29b and the dummy vias 28d, was equalized. Furthermore, at least one of the first and second dummy wirings 15b and 29b and the dummy vias 28d was connected to the ground potential.

In the above-described embodiment 5, the first dummy wirings 15b and second dummy wirings 29b are disposed in a lattice pattern, and dummy vias 28d are disposed on the intersections thereof. According to the fifth embodiment, since dummy vias 28d are disposed on the periphery of the isolated via 28, the equivalent effects as the effects obtained in the first embodiment can be obtained.

Furthermore, in the fifth embodiment, dummy patterns 15b, 28d and 29b, having the same potential through the dummy vias 28d, are connected to a ground potential at optional locations. Since circuit patterns 15, 28, and 29 are shielded by these dummy patterns 15b, 28d and 29b, the malfunction of the circuit patterns due to external noise can be inhibited. Therefore, an interconnecting structure having a high margin against external noise, and the manufacturing method thereof can be obtained.

Further, the present invention is not limited to these embodiments, but variations and modifications may be made without departing from the scope of the present invention.

The entire disclosure of Japanese Patent Application No. 2003-292166 filed on Aug. 12, 2003 containing specification, claims, drawings and summary are incorporated herein by reference in its entirety.

What is claimed is:

1. A method of manufacturing an interconnecting structure, the method comprising:
    forming a first layer including a first metal wiring and an insulator;
    forming an etching stopper layer containing nitrogen atoms on said first layer and in contact with said first metal wiring and said insulator;
    forming an interlayer insulating layer on said etching stopper layer;
    forming first and second via holes in said interlayer insulating layer, the first via hole reaching said etching stopper layer at a position directly opposite said first metal wiring and the second via hole reaching said etching stopper layer at a position directly opposite said insulator, the second via hole being located near the first via hole;
    forming a resist pattern of a chemically amplified resist on said interlayer insulating layer and filling the second via hole with resist;
    forming a groove for a second metal wiring only at an upper portion of the first via hole, remote from said first layer, by etching and removing only part of said interlayer insulating layer at the upper portion, using said resist pattern as an etching mask, the second via hole being located sufficiently near the first via hole so that, in forming the groove, resist poisoning is prevented; and
    forming the second metal wiring in the groove, a first via in the first via hole as an isolated via, and a dummy via in the second via hole by embedding a metal in the groove and in the first and second via holes, respectively.

2. The method of manufacturing an interconnecting structure according to claim 1, wherein said interlayer insulating layer includes a SiOC film.

3. The method of manufacturing an interconnecting structure according to claim 1 comprising, after forming said interlayer insulating layer, forming a cap layer on said interlayer insulating layer, and forming the first and second via holes to pass through said cap layer and into said interlayer insulating layer.

4. The method of manufacturing an interconnecting structure according to claim 1 including forming said first and second metal wirings and said first and second vias of metallic copper.

5. The method of manufacturing an interconnecting structure according to claim 1, wherein forming the first and second via holes includes:
    forming a photoresist pattern including first and second holes having respective shapes; and
    etching said interlayer insulating layer, using the photoresist pattern as an etching mask, thereby forming the first via hole having a shape following the shape of the first hole and forming the second via hole having a shape following the shape of the second hole.

6. A method of manufacturing an interconnecting structure, the method comprising:
    forming a first layer including a first metal wiring and an insulator;
    forming an etching stopper layer containing nitrogen atoms on said first layer and in contact with said first metal wiring and said insulator;
    forming an interlayer insulating layer on said etching stopper layer;
    forming first and second via holes in said interlayer insulating layer, the first via hole reaching said etching stopper layer at a position directly opposite said first metal wiring, and the second via hole reaching said etching stopper layer at a position directly opposite said insulator, and the second via hole being located near the first via hole;
    forming a resist pattern of a chemically amplified resist on said interlayer insulating layer and filling the second via hole with resist;
    forming a groove for a second metal wiring only at an upper portion of the first via hole, remote from said first layer, by etching and removing only part of said interlayer insulating layer at the upper portion, using said resist pattern as an etching mask, the groove having a width larger than openings of the first and second via holes in said interlayer insulating layer, the second via hole being located sufficiently near the first via hole so that, in forming the groove, resist poisoning is prevented; and
    forming the second metal wiring and a via by embedding a metal in the groove and in the first via hole.

* * * * *